(12) United States Patent
Maulsby et al.

(10) Patent No.: US 9,726,717 B2
(45) Date of Patent: Aug. 8, 2017

(54) TESTING SYSTEM WITH DIFFERING TESTING SLOTS

(71) Applicant: Seagate Technology LLC, Cupertino, CA (US)

(72) Inventors: Christopher Eugene Maulsby, Superior, CO (US); Allen Daryl Webb, Loveland, CO (US)

(73) Assignee: Seagate Technology LLC, Cupertino, CA (US)

( * ) Notice: Subject to any disclaimer, the term of this patent is extended or adjusted under 35 U.S.C. 154(b) by 231 days.

(21) Appl. No.: 14/577,116

(22) Filed: Dec. 19, 2014

(65) Prior Publication Data

US 2016/0003894 A1  Jan. 7, 2016

Related U.S. Application Data

(60) Provisional application No. 61/914,200, filed on Dec. 10, 2013.

(51) Int. Cl.
*G01R 31/00* (2006.01)
*G01R 31/28* (2006.01)

(52) U.S. Cl.
CPC ..... *G01R 31/2875* (2013.01); *G01R 31/2877* (2013.01)

(58) Field of Classification Search
CPC .... G01R 1/0458; G01R 1/44; G01R 31/2855; G01R 31/2862; G01R 31/2872; G01R 31/2874; G01R 31/2875; G01R 31/2877; G01R 31/2891; G01R 31/2817; G01R 31/2863; G01R 31/2868; G01R 31/2867; H01L 23/34; H01L 23/345; H01L 23/36; H01L 23/367; H01L 23/3672; H01L 23/3675; H01L 23/38; H01L 23/42; H01L 23/467
USPC ....... 73/863.11; 324/750.01, 750.03, 750.05, 324/750.06, 750.08, 750.09, 750.11, 324/750.13, 750.14, 756.02; 360/97.02; 361/679.46–679.54, 688–695
See application file for complete search history.

(56) References Cited

U.S. PATENT DOCUMENTS

| | | | |
|---|---|---|---|
| 5,601,141 A | 2/1997 | Gordon et al. | |
| 5,751,549 A | 5/1998 | Eberhardt et al. | |
| 6,204,679 B1* | 3/2001 | Gray, III | G11C 29/56 324/750.08 |
| 6,434,498 B1 | 8/2002 | Ulrich et al. | |
| 7,070,323 B2 | 7/2006 | Wanek et al. | |
| 7,131,040 B2* | 10/2006 | Co | G01R 31/2855 324/750.05 |
| 7,164,579 B2 | 1/2007 | Muncaster et al. | |
| 7,932,734 B2 | 4/2011 | Merrow et al. | |
| 8,451,608 B2 | 5/2013 | Merrow | |
| 8,466,699 B2 | 6/2013 | Merrow et al. | |
| 8,482,915 B2 | 7/2013 | Merrow | |

(Continued)

*Primary Examiner* — Arleen M Vazquez
*Assistant Examiner* — Steven Yeninas
(74) *Attorney, Agent, or Firm* — Hall Estill Attorneys at Law (57) ABSTRACT

A testing environment may have at least one controller connected to at least first and second testing slots positioned in a housing. The first testing slot can be configured with a first thermal range capability and the second testing slot may be configured with a second thermal range capability that differs from the first thermal range capability.

19 Claims, 4 Drawing Sheets

(56) References Cited

U.S. PATENT DOCUMENTS 8,630,087 B1 * 1/2014 Reynov .............. H05K 7/20563
361/679.5
2008/0239564 A1 10/2008 Farquhar et al.

* cited by examiner

TESTING SYSTEM WITH DIFFERING TESTING SLOTS

SUMMARY

A testing system, in accordance with some embodiments, has at least one controller connected to at least first and second testing slots positioned in a housing. The first testing slot is configured with a first thermal range capability and the second testing slot is configured with a second thermal range capability that differs from the first thermal range capability.

DETAILED DESCRIPTION

The proliferation of digital content and consumer use of mobile computing devices has emphasized the speed and capacity of data storage systems. Advancements in data storage devices, such as hard disk drives, have followed such emphasis by increasing data bit areal density while minimizing the physical dimensions of data accessing components. Reduced physical size of moving and stationary data storage components can be difficult to properly fabricate, assemble, and align in a manner that manufactures a data storage device with high data access accuracy and performance. While various testing mechanisms can test some aspects of data storage device performance, such testing mechanisms are laborious, time consuming, and costly. Hence, data storage device testing is a bottleneck for the implementation of electrical components with reduced physical size that can optimize data storage capacity and data access performance.

Accordingly, a testing environment may have at least one controller connected to at least first and second testing slots positioned in a housing with the first testing slot configured with a first thermal range capability and the second testing slot configured with a second thermal range capability that differs from the first thermal range capability. The ability to utilize different testing slots allows the testing environment to provide a balance between thermal testing capabilities and testing capacity for a testing environment. The use of different testing slots further allows construction, maintenance, and modification costs associated with the testing environment to be reduced as unutilized and underutilized testing capabilities are eliminated from the various testing slots.

Figure 1:
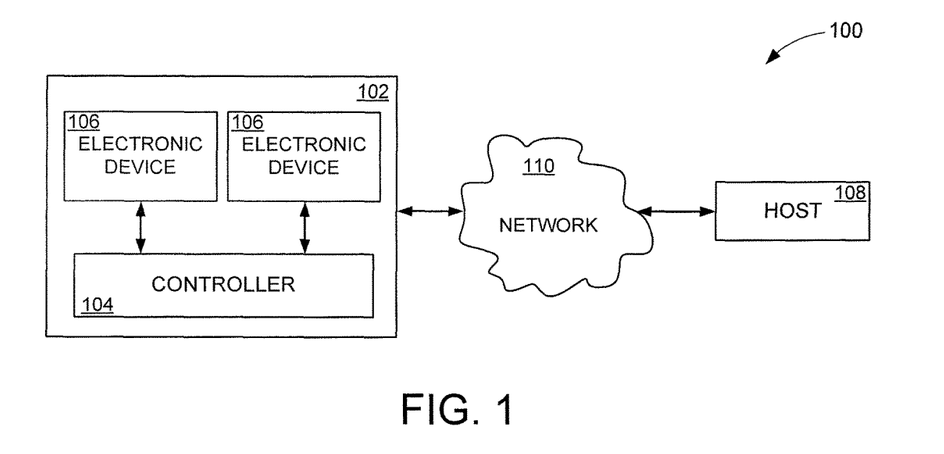
FIG. 1 is a block representation of an example data storage device testing system configured and operated in accordance with some embodiments.

FIG. 1 generally displays a block representation of an example testing system 100 that may be constructed and operated in accordance with various embodiments. The testing system 100 can have one or more racks 102 that each have at least one rack controller 104 connected to a plurality of separate electronic devices 106, such as a data storage device, via testing slots arranged in the rack 102. The rack controller 104 can direct the execution of one or more test patterns to the respective electronic devices 106 concurrently, successively, and asynchronously to identify potential defects and irregularities in the various devices 106.

The rack controller 104 can conduct testing patterns locally and in combination with a remote host 108 over a wired and/or wireless network 110. The ability to connect the rack 102 and rack controller 104 to a remote host 108 allows for real-time testing modifications and monitoring that can be utilized in concert with testing information from other racks to provide a predetermined electronic device throughput. That is, the remote host 108 may simultaneously dictate testing commands, like initiate test, terminate test, and remove device from the rack 102, in a choreographed manner so that electronic devices are sequentially ready for removal and installation instead of a large number of testing slots being idle.

Figure 2:
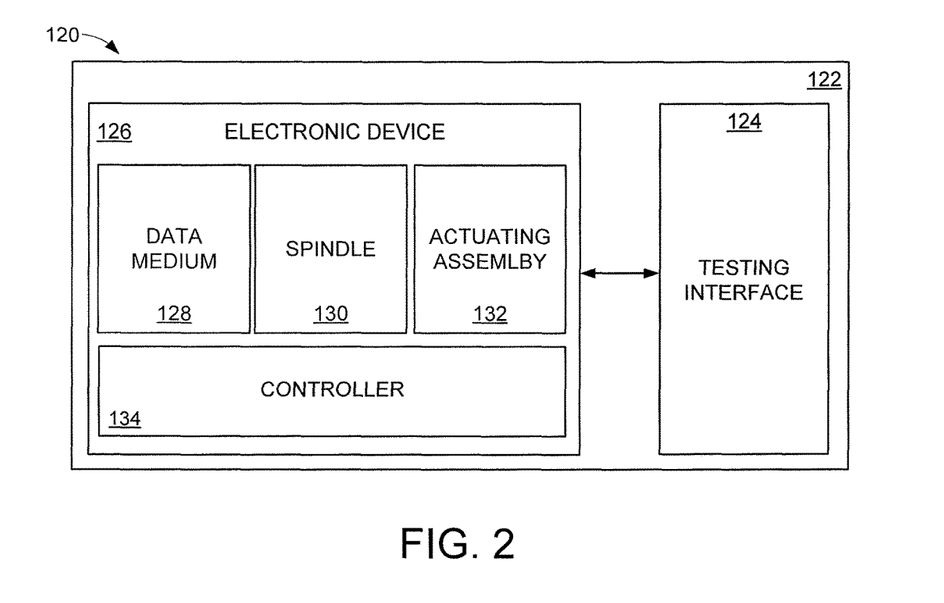
FIG. 2 displays a block representation of an example testing assembly capable of being used in the data storage device testing system of FIG. 1.

FIG. 2 shows a block representation of an example testing slot 120 that is capable of being used in the testing system 100 of FIG. 1 in accordance with some embodiments. The testing slot 120 may be have a housing 122 that partially or completely surrounds a testing interface 124 that is connected to at least one electronic device 126. It should be noted that the type of electronic device 126 that can engage the testing interface 124 and be tested is not limited. For example, an electronic device 126 may be a sensor, printed circuit board assembly (PCBA), hard disk drive, and hybrid data memory device. However, assorted embodiments configure the testing interface 124 and housing 122 to engage multiple data storage devices 126.

An electronic device 126 can be constructed and operated in an unlimited variety of manners, but can comprise at least a data storage medium 128 that rotates about a spindle 130 to engage an actuating assembly 132 across a created air bearing. Motion of the spindle 130 and actuating assembly 132 can be handled by one or more local controllers 134 that communicate through a wired and/or wireless connections to the testing interface 124 to conduct various testing protocol, such as data bit reading, programming, and error correction. The testing interface 124 can be configured to conduct the testing protocol for the data storage device 126 in combination with conducting various tests itself. For example, the testing interface 124 can return operational data, such a temperature, humidity, vibration, and electrical draw.

Figure 3:
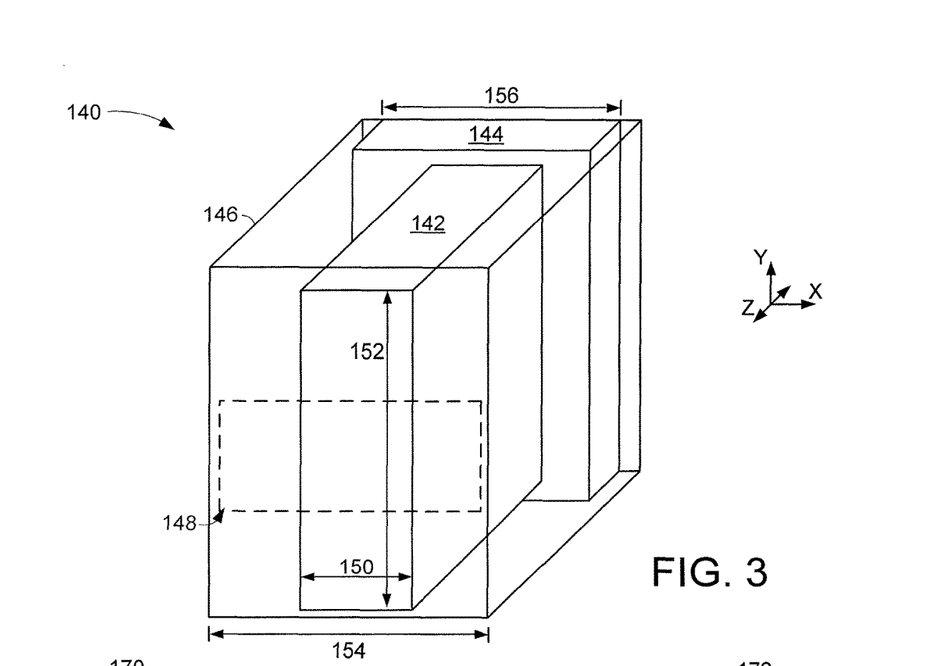
FIG. 3 shows an isometric block representation of an example testing slot capable of being used with the testing assembly of FIG. 2.

While the testing interface 124 can be configured with an unlimited number of sensors, circuits, and controllers to test and return various operational data, such testing characteristics can be expensive in terms of testing interface 124 production cost and physical size. FIG. 3 illustrates an isometric block representation of an example testing slot 140 configured in accordance with assorted embodiments to have a data storage device 142 physically engaging a testing interface 144 within a testing housing 146. It should be noted that the testing housing 146 and interface 144 can be constructed to accommodate a horizontal data storage device 142 orientation, as displayed by segmented box 148. In yet, the vertical device orientation shown by the solid lines of device 142 can be used with or without any number of housing 146 alignment features, such as grooves, notches, and sloped surfaces, which can aid in the accuracy and efficiency of a human or robot connecting and disconnecting the data storage device 142 with the testing interface 144.

The orientation of the data storage device 142 with the testing interface 144 and housing 146 can be a function of the device's dimensions, like its width 150 and height 152. That is, the width 150 or height 152 of the data storage device 142 may be less than the width 154 of the case 146 and dictate the vertical orientation shown in FIG. 3. Various embodiments configure the housing 146 with dimensions directed at optimizing testing conditions, like air flow, temperature retention, temperature dissipation, and vibration reduction. However, the dimensions and configuration of the housing 146 can correspond to the physical dimensions of the testing interface 144. It has been found that a testing interface 144 with a variety of testing capabilities, such as temperature monitoring, can increase the width 156 of the testing interface, which can consequently increase the width 154 of the housing 146.

The heightened testing capabilities of a testing slot 140 with increased electronic capabilities, such as an ability to cycle to a greater thermal range, can justify the greater housing width 154 and cost of the testing interface 144 in some situations. Although, it is contemplated that not all testing slots in a rack fully utilize the testing capabilities of a testing interface 144 with heightened thermal range capability. Hence, a data storage device testing system can be configured with testing slots having different testing interfaces, device thermal cycling range capabilities, and physical dimensions that optimize testing system cost while increasing testing capacity.

Figure 4:
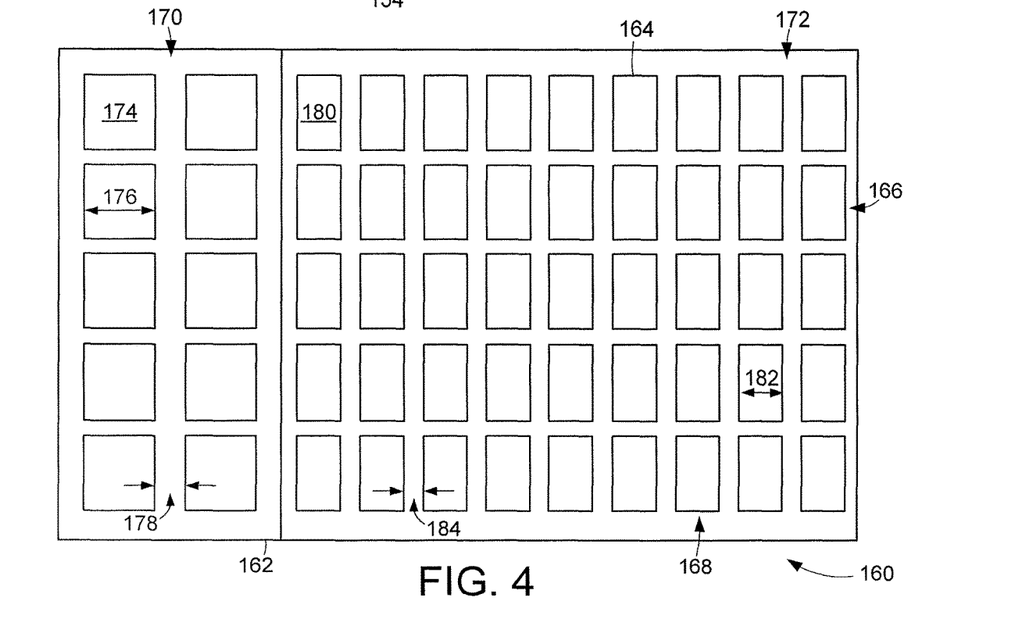
FIG. 4 illustrates a block representation of a portion of example data storage device tester configured in accordance with some embodiments.

FIG. 4 is a block representation of a portion of an example testing rack 160 constructed and operated in accordance with various embodiments. The testing rack 160 can have an overall housing 162 that is separated into any number of sealed or unsealed compartments where testing slots 164 are positioned into rows 166 and columns 168. While the entire testing rack 160 can be configured to heat and cool testing slots 164 individually or collectively, the non-limiting embodiment shown in FIG. 4 illustrates an insulated hot chamber 170 and a cool chamber 172 that respectively are separated to maintain different temperatures in the respective chambers 170 and 172.

Separation of the housing 162 into the chambers 170 and 172 can coincide with the use of differently configured testing slots 164 and different thermal production capabilities. For example, the cold chamber 172 can have at least one chiller element, like flowing air or a liquid chiller, while the hot chamber 170 employs one or more heating and cooling elements, such as the testing slots 164 themselves, that can selectively adjust the temperature of the hot chamber 170 to a predetermined thermal range, such as above 30° C., below 30° C., or a 19° C. difference in hot and cold testing temperatures. Assorted embodiments populate the hot chamber 170 with a hot testing slot 174 that has a hot width 176 and a testing interface capable of measuring, monitoring, and returning the temperature of the testing slot 174 to a rack controller.

The various hot testing slots 174 can be subjected to elevated temperatures, as dictated by the rack controller activating a heater for the hot chamber 170 as a whole and potentially heaters in each hot testing slot 174. As such, the various hot testing slots 174 can be maintained at similar or dissimilar elevated temperatures, such as above 40° C., which may be controlled passively by tuning the lateral separation distance 178 between hot testing slots 174. The increased cost, space, and complexity of the hot chamber 170 is contrasted by the cold testing slots 180 that have a smaller cold width 182, lateral separation distance 184, and thermal range capability compared to the hot chamber 170.

The reduced cold widths 182 can be specifically due to each cold testing slot 180 being temperature agnostic by having a testing interface without one or more testing capabilities that the hot testing slots 174 have, such as temperature sensors that correspond with a reduced thermal range. The elimination of testing capabilities from the testing interfaces of the respective cold testing slots 180 can thereby reduce production cost and cold width 182 that allows more cold testing slots 180, such as a 9:1 ratio of cold 180 to hot 174 testing slots, to be fit in the housing 162. That is, using testing slots with smaller widths can increase the testing capacity of the testing rack 160 compared to if the entire system was populated with the wider hot testing slots 174.

Figure 5:
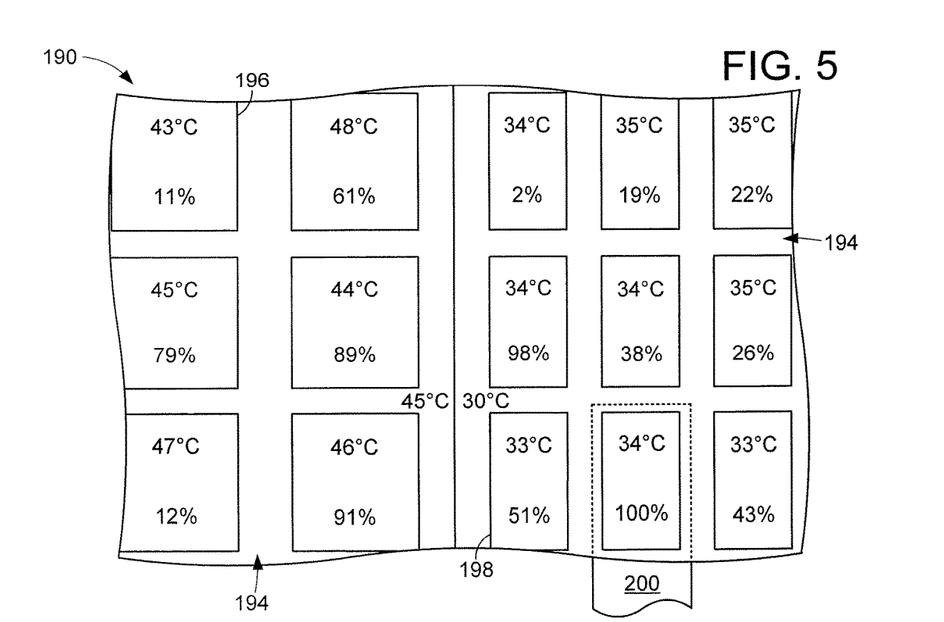
FIG. 5 provides a block representation of a portion of an example data storage device tester constructed and operated in accordance with various embodiments.

FIG. 5 displays a block representation of a portion of an example testing rack 190 constructed and operated in accordance with assorted embodiments. The testing rack 190 has a combination of hot 192 and cold 194 chambers that are respectively maintained at different temperatures, as shown. While not limiting, it is contemplated to tune the number of respective hot and cold chambers 192 and 194 to provide hot and cold thermal cycling that corresponds to elevated data storage device throughput. That is, the number of hot testing slots 196 are selected to maintain a predetermined data storage device testing throughput. In some embodiments, the physical size of the hot chamber 192 and number of hot testing slots 196 are tuned so that less than all of the testing slots of the rack 190 are thermally cycled, such as between temperatures of 30-45° C., but a sufficient number of data storage devices are cycled to subsequently populate the cold testing slots 198 and finalize testing routines at greater than a minimum testing rate, such as 100 drives an hour.

It can be appreciated that the data storage devices can be moved, either by human or by robot 200, between the hot 192 and cold 194 chambers before and during a predetermined testing routine to provide a range of testing environments. Such data storage device movement can be tuned to optimize the use of the respective hot 192 and cold 194 chambers without increasing the overall testing time for the data storage device compared to the data storage device remaining in a single testing slot for thermal cycling and other testing conditions. For example, some data storage devices may be thermally cycled in the hot chamber 192 before being moved to the cold chamber 194 while other data storage devices are thermally cycled in the hot chamber 192 after cold chamber 194 testing operations are conducted.

The thermal cycling in the hot chamber 192 may coincide with heating and cooling means that can operate throughout the chamber 192, within a hot testing slot 196, or both to allow the respective testing slots 196 to be at different temperatures, as shown. The heating and cooling means of the hot chamber 194 can increase complexity and cost of the testing rack 190. In contrast, the cold chamber 194 has a smaller thermal range capability that corresponds with minimal temperature control and complexity, which may have collective convective cooling across the cold testing slots 198 exclusively in some embodiments. With the temperature control and a wider range of possible temperatures in the hot chamber 194, data storage devices can be moved between hot testing slots 196 as part of an overall testing routine.

The ability to provide different temperatures both between the hot 192 and cold 194 chambers and between the hot testing slots 196 can complement asynchronous testing of data storage devices, as dictated by one or more local and remote rack controllers. For clarity, a synchronous testing routine would populate some or all of the testing slots of the testing rack 190 before initiating a testing routine and subsequently ending the testing routine for all populated slots. A synchronous testing routine can be inefficient as time is wasted during the loading and unloading of the various data storage devices. Furthermore, synchronous testing inherently has all testing slots with the same capabilities to allow the same testing conditions to be present for all devices under test, which can be complex and wasteful as thermal cycling can comprise less than a third of an overall testing routine that can last 150 hours or more.

Accordingly, the dissimilar testing slots 196 and 198 in combination with the dissimilar chambers 192 and 194 can provide a full range of testing capabilities as well as the ability to asynchronously test data storage devices to maximize testing efficiency. The non-limiting example embodiment shown in FIG. 5 illustrates how each testing slot is at a different progression through a testing routine. It is contemplated that a common testing routine is applied to each data storage device upon engagement with a testing slot, but various embodiments utilize multiple different testing routines that adapt to previously logged test results and test times to optimize testing performance and efficiency.

In assorted embodiments, the testing routines are configured with respect to the speed with which the robot 200 can load and unload data storage devices. That is, the testing routines are conducted so that the time between different data storage devices finishing respective testing routines coincides with the amount of time it takes the robot 200 to unload the tested device and load a different device, which may or may not have undergone previous testing in another portion of the testing rack 190. With the ability to utilize different testing routines, testing slot temperatures, and testing progressions at any given time, the testing rack 190 can be continually testing data storage devices with optimizes efficiency that is complemented by the increased number of cold testing slots 198 available due to the reduced width of the cold testing slots 198 due to the constituent testing interfaces not having temperature sensors as a result of the cold chamber 194 merely having convective cooling capabilities.

While the testing efficiency of the testing rack 190 can be optimized through the use of dissimilar testing slots, routines, and chambers in combination with asynchronous testing schedules, excess amounts of energy can be consumed through inefficient heating and cooling of the hot chamber 194. Such inefficiency can be counteracted by the example testing rack 210 of FIG. 6, which is configured in accordance with various embodiments to utilize the rising nature of heat to minimize the amount of energy consumed and the time associated with altering the hot chamber 212 to hot and cold predetermined testing temperatures.

Figure 6:
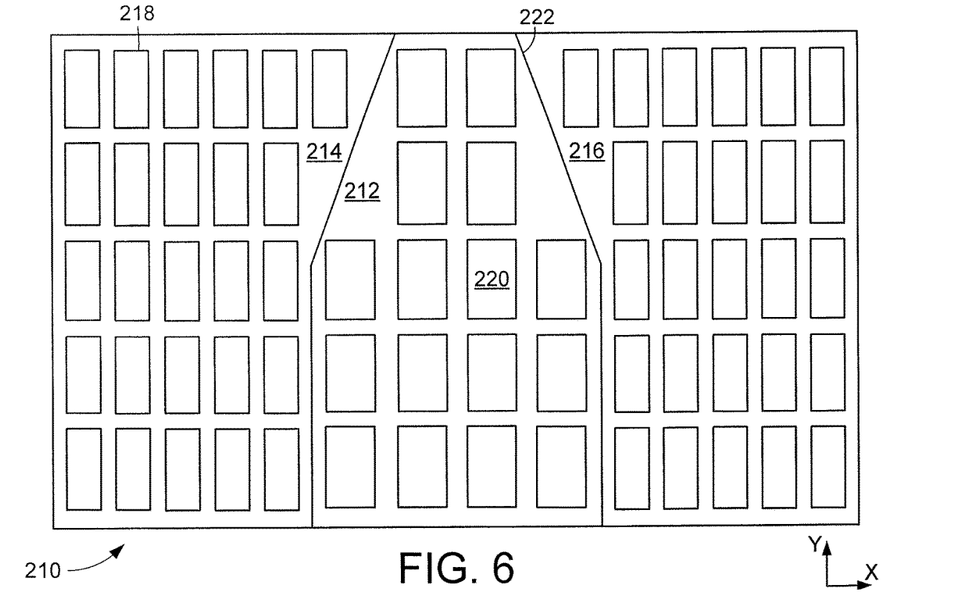
FIG. 6 displays a block representation of a portion of an example data storage device tester configured in accordance with assorted embodiments.

As displayed, the testing rack 210 is separated roughly into thirds with the hot chamber 212 disposed between first 214 and second 216 cold chambers that have only convective cooling capabilities and thinner non-temperature sensing cold testing slots 218. The hot chamber 212 may be positioned anywhere within the testing rack 210, but can take advantage of heat produced from the cold testing slots 218, as well as the heat from lower hot testing slots 220, by sloping the hot chamber sidewalls 222 to funnel heat upwards along the Y axis. The tuned sidewall 222 slope can reduce the amount of chamber 212 and individual testing slot 220 heating and cooling that is needed to transition the respective testing slots 220 between predetermined hot and cold testing temperatures.

It can be appreciated that the pyramid configuration of the hot chamber 212 shown in FIG. 6 is not required or limiting, but can accumulate heat from the operation of data storage devices below towards the hot testing slots 220 near the top of the rack 210. Such accumulation of heat may reduce the amount of energy necessary to bring the hot testing slots 220 to an elevated temperature. Likewise, the focusing of heat upwards can aid in removing heat from the hot chamber 212 with fans, such as by directing cooling air from the bottom of the rack 210 to the top to reach a lowered testing temperature more efficiently than if the sidewalls 222 were not sloped to funnel heat. With the ability to tune the shape and size of the hot chamber 212, the energy consumption of the testing rack 210 can be optimized to complement the enhanced rack capacity, cost, and testing capabilities provided by housing multiple testing slots with different testing capabilities in the testing rack 210.

Figure 7:
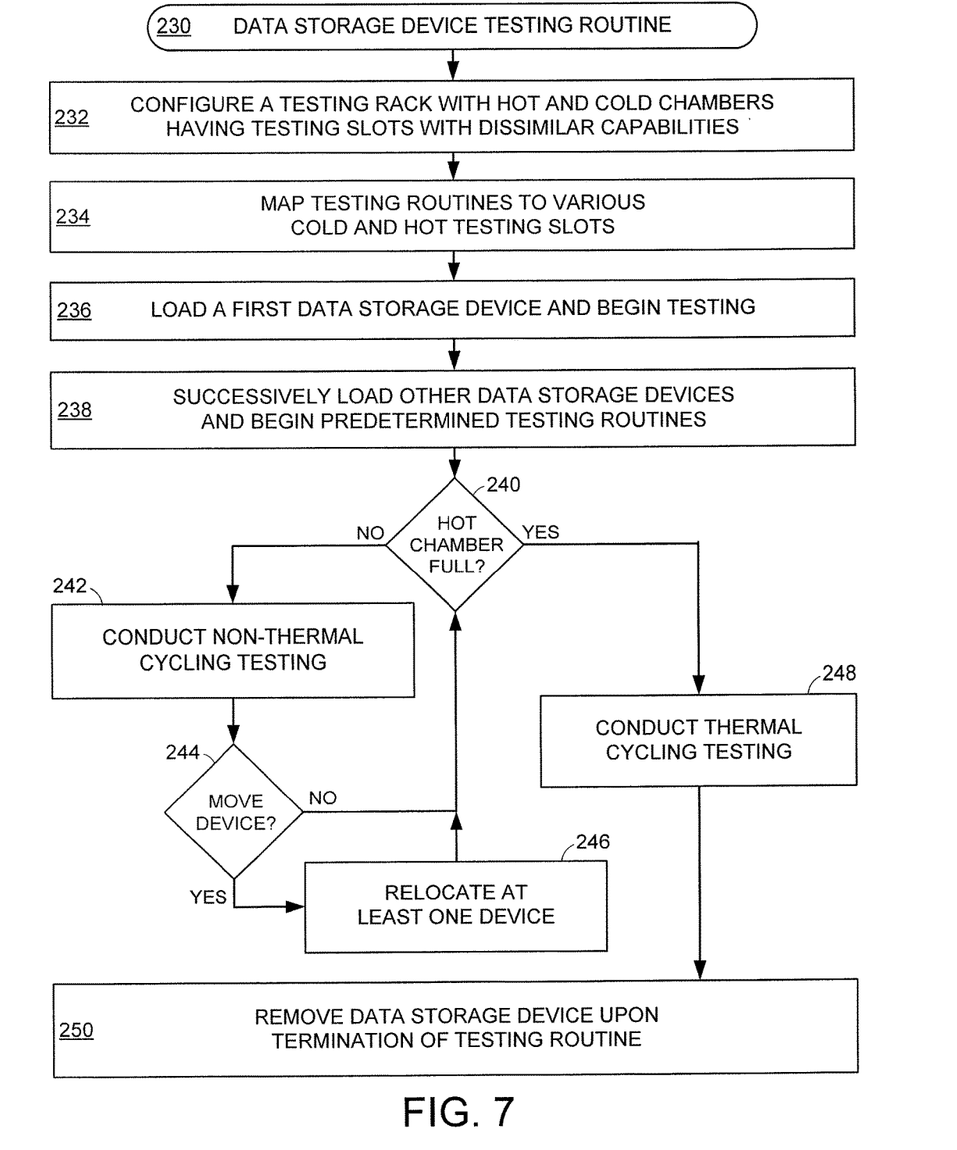
FIG. 7 provides a flowchart of an example data storage device testing routine carried out in accordance with various embodiments.

The diverse variety of testing slots and thermal testing range capabilities can be managed by one or more rack controllers in an unlimited number of manners to provide optimized testing of a plethora of data storage devices that may be different memory types, capacities, and speeds. FIG. 7 is an example data storage device testing routine 230 that can be carried out in accordance with various embodiments to provide optimize data storage device testing within one or more testing racks. While not limiting or required, step 232 may begin routine 230 by configuring at least one testing rack with a predetermined ratio of hot and cold chambers, such as 60-90% of the total testing slots being temperature agnostic testing slots, which respectively have testing slots with dissimilar testing capabilities and physical dimensions. The size, shape, and number of testing slots for the respective hot and cold chambers can be tuned, in some embodiments, to optimize testing rack capacity, efficiency, and performance.

The presence of the testing rack populated with testing slots having different testing interfaces that results in dissimilar testing capabilities and physical widths allows one or more local and remote rack controllers to map actual, possible, and alternative testing routines in step 234 that selectively utilize the hot and cold testing slots. That is, step 234 can assess the number of available cold and hot testing slots and generate testing routines that may or may not choreograph the movement of data storage devices between chambers and testing slots. Step 234 may further create contingency testing routines that are triggered upon an anticipated situation, such as a failed device test, power outage, testing slot failure, and loss of temperature control.

For instance, a primary testing routine can dictate an incoming data storage device's chamber, testing slot, progression of tests, such as vibration, temperature, and data access tests, and predicted time of completion that involves the relocation of the data storage device from the cold to the hot chamber while a contingency testing routine alternatively keeps the data storage device in a single testing slot and schedules the next available hot testing slot so the device can be thermally cycled. The generation of multiple different testing routines in step 234 prior to loading data storage devices into the testing rack can allow a rack controller to adapt to changing conditions, like replacement of a testing slot, without having to bring the entire testing rack offline.

The proactive mapping of testing routines in step 234 can lead the way for robotic loading of a first data storage device in a predetermined testing slot and initiation of a testing routine in step 236 before other data storage devices are successively loaded and engaged with respective testing routines in step 238. Through the sequential loading and testing of data storage devices in steps 236 and 238, asynchronous device testing can be conducted that may or may not involve different testing routines, testing temperatures, and testing durations. As discussed above, the cold chamber can exclusively be equipped with convective cooling fans that continually or sporadically operate to passively keep cold testing slots below an overheating threshold. In contrast, the hot chamber is equipped with means of heating and cooling the chamber as a whole and, in some embodiments, as individual hot testing slots. Hence, some embodiments wait until the hot chamber is populated with a predetermined number of data storage devices, such as half-full or completely full, before adjusting temperature in the chamber in combination with heating of individual hot testing slots with a heating element, such as a resistive coil. Such provision can allow for thermal cycling in the hot chamber that is both energy and time efficient.

Decision 240 follows such provision by evaluating if the hot chamber has reached a predetermined occupancy of data storage devices being tested or loaded into testing slots awaiting testing. In the event the hot chamber is not filled with enough data storage devices to begin controlling the temperature of the chamber, step 242 can conduct non-thermal cycling testing with hot testing slots in the hot chamber. Assorted embodiments conduct thermal cycling in less than all the hot testing slots of the hot chamber and without controlling the temperature of the entire hot chamber by utilizing individual testing slot heating and cooling means. In other words, step 242 may be conducted on some testing slots of the hot chamber while other hot testing slots individually alter temperature within the respective testing slots to thermally cycle and test less than all the data storage devices populating the hot chamber.

The ability to conduct non-thermal cycling testing as well as localize thermal cycling can allow a rack controller to optimize testing as various hot chamber and hot testing slot capabilities can be utilized to provide accurate and efficient data storage device testing. Step 242 may further be involved in the movement of data storage devices to the hot chamber from the cold chamber to reach the predetermined threshold population determined in decision 240. Thus, decision 244 evaluates if one or more data storage devices are to be moved. Step 246 proceeds to relocate at least one data storage device to the hot chamber if decision 244 determines a device can or should be moved. The relocation of a data storage device, in various embodiments, may coincide with the rack controller switching to an alternate or contingency testing routine mapped in step 234, but such is not required.

At the conclusion of step 246 or if decision 244 chooses not to move a data storage device to the hot chamber, decision 240 is revisited to determine if overall hot chamber thermal cycling can be conducted. A hot chamber device population above the predetermined threshold advances routine 230 to step 248 where temperature in the hot chamber is altered between a given range, such as 30-45° C., before, during, and after one or more data storage tests, such as fly height adjustment and microactuator tuning, are conducted. It is contemplated that the thermal cycling testing begins or concludes the overall testing scheme for a particular data storage device. As such, step 248 may conduct non-thermal cycling testing, which may be similar or dissimilar to the testing of step 242, or the data storage device may be relocated to the cold chamber to finalize testing while opening up a hot testing slot for thermal cycling of the next data storage device.

In the event step 248 concludes data storage device testing, as dictated by the testing routine mapped in step 234, step 250 can then remove the data storage device after termination of the testing routine. It should be noted that step 250 may be executed upon termination of a testing routine for various reasons, such as device failure and testing slot malfunction. Regardless of the reason for step 250 removing a data storage device from the testing rack, the rack controller can next initiate the installation and testing of another data storage device.

It can be appreciated that routine 230 allows for a variety of different testing operations that are configured macroscopically and microscopically to provide optimized testing of large numbers of data storage devices. It should be noted, however, that the steps and decisions shown in FIG. 7 are not required or limiting as the routine 230 can be changed with various aspects being added, removed, and changed. For example, the routine 230 may proceed immediately to step 250 after a device is loaded into a cold testing slot in step 236 and subsequently tested without thermal cycling.

Through the assorted embodiment, one or more data storage devices can be tested in a testing rack that is configured to optimize the device undergoing a number of different evaluations, such as vibration, temperature, and bit error rate. The ability to utilize different testing rack chambers corresponding to testing slots with different widths allows increased data storage device capacity in the rack along with a diverse variety of testing options relating to the different chambers. The utilization of a rack controller to generate testing routines and execute those routines at will allows the testing rack to adapt to changing environmental and operational conditions without degrading data testing performance or tested device throughput. Additionally, the use of testing slots with dissimilar testing capabilities can reduce the production, energy consumption, and maintenance costs associated with the testing rack.

In some embodiments, 80% of the slots are low cost and temperature agnostic because they do not have the capability to set a specific temperature. The slots can provide a heat exchange using chilled water that a fan blows air across to provide cooling, but only sufficient to insure the drive does not exceed the max temperature of the product specification and limits temperature variability. In other embodiments, 20% of the slots have high thermal control capability that provides the ability to select a specific temperature from across a hot to cool temperate range, achieve and regulate that temperature. The slot includes one or more heating elements for heat and a heat exchange using chilled water for cooling. There can be a programmable fan and mechanism that controls the air flow across the heating element and/or the cooling element to provide cool or warm air across the drive to achieve the temperature control as desired.

It will be appreciated that the technology described above can readily be utilized in any number of applications, including solid-state memory. It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed. For example, the particular elements may vary depending on the particular application without departing from the spirit and scope of the present disclosure.

What is claimed is:

1. A testing system comprising at least one controller connected to a first testing slot and a second testing slot, each testing slot slots positioned in a housing and sized to house a single data storage device, the first testing slot comprising a first testing interface connected to a single first data storage device and having a first width corresponding to a heating element that provides a first thermal range capability, the second testing slot comprising a second testing interface connected to a single second data storage device and having a second width corresponding with the second testing slot not being able to control temperature that provides a second thermal range capability, the first thermal range capability differing from the second thermal range capability, the first width being greater than the second width.

2. The testing system of claim 1, wherein the first thermal range capability and first width corresponds with the first testing slot having the heating element and a cooling element.

3. The testing system of claim 1, wherein the housing arranges a plurality of first testing slots and a plurality of second testing slots concurrently in a first row of testing slots, the first row of testing slots comprising a 1:9 ratio of first to second testing slots.

4. The testing system of claim 1, wherein the housing is divided into a hot region and a cold region, the first testing slot positioned in the hot region and the second testing slot positioned in the cold region.

5. The testing system of claim 4, wherein the cold region has a cooling element supplying moving air to each testing slot of the cold region concurrently.

6. The testing system of claim 4, wherein a plurality of first testing slots are positioned in the hot region and separated by a first lateral distance, a plurality of second testing slots are position in the cold region and separated by a second lateral distance that is greater than the first lateral distance.

7. The testing system of claim 1, wherein the first testing slot comprises a first testing interface with a larger physical area than a second testing interface positioned in the second testing slot.

8. The testing system of claim 1, wherein the first thermal range capability extends above 40° C. and the second thermal range capability extends below 40° C.

9. An apparatus comprising at least one controller connected to a first testing slot and a second testing slot, each testing slot positioned in a housing and sized to house and test a single data storage device, the first testing slot having a first testing interface with a first width measured along a first axis providing a first thermal range capability, the second testing slot having a second testing interface with a second width measured along the first axis providing a second thermal range capability that differs from the first thermal range capability, the first width being greater than the second width and the first thermal range capability being greater than the second thermal range capability.

10. The apparatus of claim 9, wherein the first and second widths each are greater than a device width of each data storage device positioned within the respective first and second testing slots.

11. The apparatus of claim 9, wherein a plurality of first testing slots are arranged in a pyramid configuration along a plane defined by the first axis and a second axis oriented perpendicular to the first axis.

12. The apparatus of claim 9, wherein the first and second testing slots are individually accessible by a robot.

13. A method comprising:
connecting a controller to a plurality of first testing slots and a plurality of second testing slots; and
positioning the plurality of first testing slots in a hot region of the housing with a first separation distance, each first testing slot of the plurality of first testing slots having a first thermal range capability; and
arranging the plurality of second testing slots in a cold region of the housing with a second separation distance, the first separation distance being smaller than the second separation distance, each second testing slot of the plurality of second testing slots having a second thermal range capability that differs from the first thermal capability.

14. The method of claim 13, wherein at least one of the plurality of first testing slots is heated to a temperature above 40° C. while at least one of the plurality of second testing slots is cooled to a temperature below 40° C.

15. The method of claim 13, wherein the controller concurrently executes different first and second testing programs for the respective first and second pluralities of testing slots.

16. The method of claim 15, wherein the first testing program thermally cycles the at least one first testing slot of the plurality of first testing slots to a hot temperature above 40° C. and to a cold temperature below 40° C. while the second testing program maintains at least one second testing slot of the plurality of second testing slots at a temperature below 40° C.

17. The method of claim 13, wherein at least two testing slots of the first plurality of testing slots are simultaneously at different levels of progress of a common testing program executed by the controller.

18. The method of claim 13, wherein at least one second testing slot of the plurality of second testing slots is unused while at least one second testing slot of the plurality of second testing slots executes a testing program executed by the controller.

19. The method of claim 13, wherein at least one first testing slot of the plurality of first testing slots has an activated heating element while at least one first testing slot of the plurality of first testing slots has a deactivated heating element and each second testing slot of the plurality of second testing slots is convectively cooled concurrently.

* * * * *